(12) United States Patent
Franz et al.

(10) Patent No.: US 9,725,311 B2
(45) Date of Patent: Aug. 8, 2017

(54) MICROMECHANICAL COMPONENT HAVING HERMETIC THROUGH-CONTACTING, AND METHOD FOR PRODUCING A MICROMECHANICAL COMPONENT HAVING A HERMETIC THROUGH-CONTACTING

(71) Applicant: Robert Bosch GmbH, Stuttgart (DE)

(72) Inventors: Jochen Franz, Reutlingen (DE); Simon Armbruster, Wannweil (DE); Helmut Grutzeck, Kusterdingen (DE); Joerg Muchow, Reutlingen (DE); Frederic Njikam Njimonzie, Reutlingen (DE); Andreas Duell, Stuttgart (DE); Johannes Baader, Wannweil (DE); Stefan Liebing, Kiebingen (DE); Rainer Straub, Ammerbuch (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/614,053

(22) Filed: Feb. 4, 2015

(65) Prior Publication Data

US 2015/0232330 A1 Aug. 20, 2015

(30) Foreign Application Priority Data

Feb. 17, 2014 (DE) .................. 10 2014 202 825

(51) Int. Cl.
*B81B 1/00* (2006.01)
*B81C 1/00* (2006.01)
*B81B 7/00* (2006.01)

(52) U.S. Cl.
CPC .......... *B81C 1/00277* (2013.01); *B81B 7/007* (2013.01); *B81B 7/0035* (2013.01); *B81B 2207/095* (2013.01); *B81B 2207/097* (2013.01); *B81C 2203/0109* (2013.01)

(58) Field of Classification Search
CPC ......... H01L 2924/00; H01L 2924/1461; H01L 2924/00014; H01L 2924/0002; H01L 23/481; H01L 2224/85205; H01L 2924/00013; H01L 2224/45144; H01L 2924/01014; H01L 2224/83487; H01L 2224/80379
See application file for complete search history.

(56) References Cited

U.S. PATENT DOCUMENTS 7,358,106 B2 4/2008 Potter
2009/0152705 A1* 6/2009 Breng ................ B81C 1/00333
257/690

* cited by examiner

*Primary Examiner* — Tony Tran
(74) *Attorney, Agent, or Firm* — Norton Rose Fulbright US LLP; Gerard Messina

(57) ABSTRACT

A micromechanical component includes: a hermetically sealed housing; a first functional element that is situated inside the housing; a first structured electrically conductive layer that contacts the first functional element and that is situated inside the housing; and a second structured electrically conductive layer, the first conductive layer being electrically contacted via the second conductive layer, and the second conductive layer being electrically contacted laterally through the housing via a hermetic through-contacting in the second conductive layer.

6 Claims, 5 Drawing Sheets

(A-A')

(B-B')

MICROMECHANICAL COMPONENT HAVING HERMETIC THROUGH-CONTACTING, AND METHOD FOR PRODUCING A MICROMECHANICAL COMPONENT HAVING A HERMETIC THROUGH-CONTACTING

BACKGROUND OF THE INVENTION

1. Field of the Invention

The present invention relates to a micromechanical component having a hermetic through-contacting, and to a method for producing a micromechanical component having a hermetic through-contacting. The hermetic through-contacting is in particular a lateral through-contacting, relative to at least one substrate of the component.

2. Description of the Related Art

It is frequently advantageous to hermetically pack electronic circuits, sensors, MEMS, or MOEMS. This is usually done primarily for protection against harsh environmental influences, such as chemical attack, corrosion, humidity, mechanical action, heat, or radiation. In particular in the case of MEMS or MOEMS, it is frequently the case that a particular internal pressure is to be set that guarantees a defined damping in the system.

U.S. Pat. No. 7,358,106 B2 describes a hermetically sealed component for a MEMS assembly. A part of the packing covering is bent around under the component in order to ensure long-lasting sealing of the component. The MEMS assembly is connected via bonding wires to through-contactings that are fashioned perpendicularly through a base substrate of the component in order to contact the MEMS assembly.

BRIEF SUMMARY OF THE INVENTION

Accordingly provided is a micromechanical component having a hermetic through-contacting, having: a hermetically sealed housing; a first functional element situated inside the housing; a first structured electrically conductive layer that contacts the first functional element and that is situated inside the housing; and a second structured electrically conductive layer, the first conductive layer being electrically contacted via the second conductive layer, and the second conductive layer being capable of being electrically contacted laterally through the housing via a hermetic through-contacting in the second conductive layer.

A lateral direction is to be understood in particular as a direction parallel to a substrate, for example a base substrate, which direction is thus oriented perpendicular to a normal to the base substrate.

The lateral through-contacting can in particular be accomplished through trenches whose side walls are electrically insulated by a passivation, and which are filled for example with a metal or with polysilicon. After a deposition of a passivation layer, the sunk conductors, such as metallic conductors, are passivated all around. The surface can be planarized, before for example bonding a further wafer against it.

Further provided is a method for producing a micromechanical component, having the steps: fashioning of a first functional element on a first substrate; fashioning, on the first substrate, of a first structured electrically conductive layer that contacts the first functional element; fashioning of a second structured electrically conductive layer on the first substrate, the first conductive layer being electrically contacted via the second conductive layer; and fashioning of a housing that hermetically seals the first functional element and the first structured electrically conductive layer; the second conductive layer being capable of being electrically contacted laterally through the housing via a hermetic through-contacting in the second conductive layer.

The finding on which the present invention is based is that the fashioning of vertical through-contactings, i.e. perpendicular to a substrate, on a micromechanical component often requires a considerable technical outlay, or is impossible. This is the case for example if a low-ohmic through-contacting (advantageously having a resistance less than 1 ohm) is to be realized in a hermetically sealed chip, for a current-driven micro-mirror. Here, standardly a magnet is situated on a first side of a micro-mirror, and an optical window is situated on another, oppositely situated side of the micro-mirror. Through a formation of lateral through-contactings, a micromechanical component can be provided that requires a relatively small technical outlay and that has long-term stability, but that can nonetheless meet high demands. Such demands can include for example the requirement of a high maximum current that can be supplied, with simultaneous very long operating life.

The underlying idea of the present invention is thus to take this recognition into account, and to provide a micromechanical component having lateral through-contactings that is hermetically sealed and in which it is nonetheless possible to conduct comparatively high electric currents. In addition, the component is particularly robust against standard environmental influences that can impair or reduce the functioning and/or the operating life of the component.

Advantageous specific embodiments and developments result from the subclaims, and from the description with reference to the Figures.

According to a preferred development, the hermetic through-contacting has a large number of printed conductors connected in parallel. In this way, the individual printed conductors can be fashioned with small dimensions, in particular small cross-sectional surfaces, while at the same time a relatively large current can be conducted via the printed conductors. Printed conductors having small cross-sectional surfaces can be less susceptible to mechanical stresses resulting from increasing temperatures, which can cause cracks in insulating trenches. In addition, it is advantageous if a passivation over metal conductors is planar after polishing, so that no parasitic channels form that could result in leaks. In the case of thin printed conductors, i.e. printed conductors having small cross-sectional surfaces, the probability is relatively low that the passivation will still have a residual topography after the polishing.

In addition, thick passivations are advantageous, in particular over the through-contacting printed conductors, because in this way the effect can be reduced of a residual topography remaining after the polishing. Relative to an overall layer stack of the micromechanical component, the printed conductors are advantageously situated as close as possible to a substrate surface.

According to a further preferred development, the component further has a second functional element that is situated inside the housing, having a second current requirement that is less than a first current requirement of the first component. The second functional element is electrically contacted via the second structured conductive layer. In this way, the formation of additional planes and structures can be avoided, by using the second conductive layer not only for the through-contacting but also for the contacting of the second element.

According to a further preferred development, the housing has a substrate on which a bonding frame is attached. The second conductive layer is situated between the first conductive layer and the substrate.

According to a further preferred development, the second conductive layer is insulated from the substrate. This can be accomplished for example by an oxide layer. In this way, potentially disturbing leakage currents are reduced or prevented.

According to a further preferred development, the second conductive layer has an electrical connection to the substrate. The electrical connection is accomplished via a first well fashioned on the substrate. The first well has polarity in the blocking direction relative to the substrate. In this way, when there is an application of alternating current to the first functional element it is also possible to reduce or prevent potentially disturbing leakage currents that could hinder the regulation of the component, in particular of an actuating element of the component.

According to a further preferred development, a first contact of the first component is contacted via a first hermetic through-contacting. A second contact of the first component can be contacted via a second hermetic through-contacting. The first hermetic through-contacting can be connected to the substrate via the well fashioned in the substrate. The second hermetic through-contacting can be connected to the substrate via a second well fashioned in the substrate. The first and the second well can be applied to a common potential. Thus, the wells can have polarity in the blocking direction, for example relative to a substrate, so that for example no electrical currents can flow to the substrate from the first or second through-contacting.

According to a further preferred development, a metallization made of tungsten is carried out of the through-contacting, or of one or all of a plurality of through-contactings. The probability of an undesirable electromigration can be reduced through the relatively high current-bearing capacity of such through-contactings. A metallization of the first component and/or of the first conductive layer is advantageously realized in copper. In this way, there can result a particularly low electrical resistance for the corresponding elements. A metallization of the through-contacting is advantageously situated over salicidated silicon. In this way, the influence of printed conductors that are interrupted at a point can be practically completely leveled out. Instead of over salicidated silicon, the metallization of the through-contacting can also be situated over a diffusion and/or over a combination of diffusion and salicide.

According to a preferred development of the production method according to the present invention, a deposition of a metallization of the first and/or of the second conductive layer takes place by physical gas phase deposition, chemical gas phase deposition, and/or tampon galvanizing.

The present invention is explained in more detail below on the basis of the exemplary embodiments shown in the schematic Figures of the drawings.

DETAILED DESCRIPTION OF THE INVENTION

Figure 1:
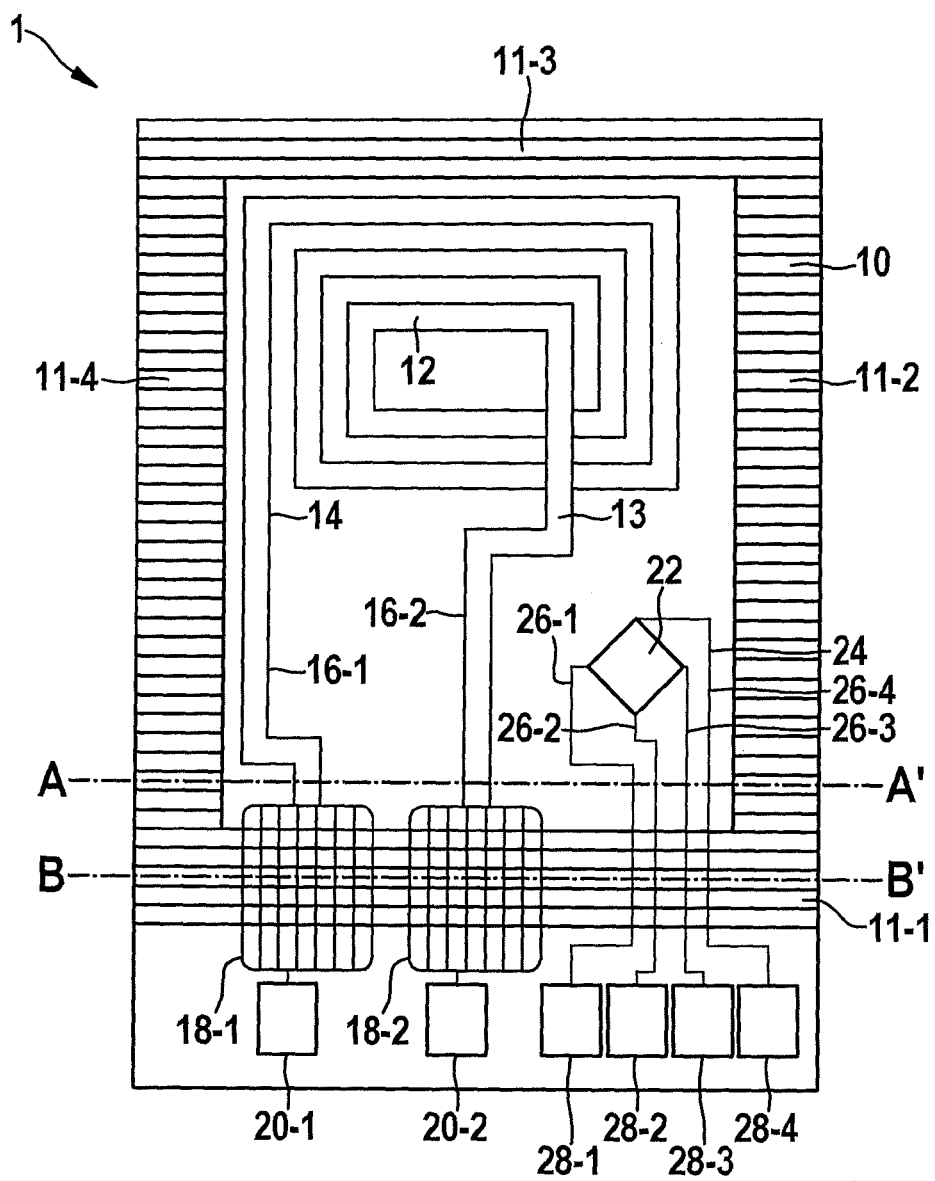
FIG. 1 shows a schematic top view of a micromechanical component according to a first specific embodiment of the present invention.

In all the Figures, identical or functionally identical elements and devices have been provided with the same reference characters, unless otherwise indicated. The letter "i" functions partly as a placeholder for numbers in reference characters in order to enable a more concise and comprehensible description.

FIG. 1 shows a schematic top view of a micromechanical component according to a first specific embodiment of the present invention. In FIG. 1, some layers have been shown as transparent for better understanding, so that important elements of the component can be described simultaneously and in their configuration relative to one another. FIG. 1 partly makes reference to reference characters that are shown in the following FIGS. 2 and 3.

Micromechanical component 1 has a hermetically sealed housing 10. In hermetically sealed housing 10 there can be a hollow space in which for example a particular internal pressure can be set. If movable functional elements are situated inside housing 10, a defined damping of the movable components can advantageously be guaranteed through the set internal pressure. Such a hollow space, or cavern, can for example be situated between first through fourth walls 11-1, 11-2, 11-3, 11-4 of a bonding frame of housing 10. Bonding frame having walls 11-i can be part of a first wafer having a first substrate 30, by which a limiting surface of the cavern can also be formed. Bonding frame 11-i can have oxide layers, or can be made up of oxide layers. A final hermetic sealing of the cavern can take place through bonding of the first wafer and of a second wafer. Here, for example an anodic glass bonding, a eutectic bonding, or a seal-glass bonding can be used. In order to realize a reduced internal pressure inside the cavern, bonding processes can be carried out in a vacuum.

According to FIG. 1, inside housing 10 there is situated a coil 12 as a first functional element. According to the first specific embodiment, coil 12 is a planar, cornered spiral having three windings, formed for the most part as part of a first structured electrically conductive layer 14. Coil 12 can be produced in a planar copper method. A first end of coil 12 is contacted by a first conductor segment 16-1. A second end of coil 12 is contacted by a second conductor segment 16-2. Conductor segments 16-1, 16-2 are likewise part of first structured electrically conductive layer 14. Coil 12 is electrically connected to second conductor segment 16-2 via a third conductor segment 13, fashioned in a third structured electrically conductive layer. According to the first specific embodiment, third conductor segment 13 is parallel to a first plane E1 in which planar coil 12 is situated.

First structured electrically conductive layer 14 advantageously has, as current-bearing elements, copper conductors having the largest possible cross-section. The copper conductors are insulated all around, including against a substrate of the component.

First conductor segment 16-1 is electrically connected to a first hermetic through-contacting 18-1 through first wall of 11-1 of the bonding frame. First through-contacting 18-1 is fashioned in a second plane E2 that is separated from first plane E1 but that is adjacent to first plane E1. First through-contacting 18-1 has a first multiplicity of printed conductors connected in parallel. First through-contacting 18-1 is electrically conductive and extends laterally, relative to first and second plane E1, E2, through first wall 11-1 of hermetically sealed housing 10. First plane E1 can for example be between 1 and 10 µm, preferably between 2 and 8 µm, in particular between 3 and 6 µm in height.

The first multiplicity of printed conductors connected in parallel is configured in a row between first conductor segment 16-1 and a first contact pad 20-1. First contact pad 20-1 is situated on the outside of housing 10. Via first contact pad 20-1, first through-contacting 18-1 having the first multiplicity of printed conductors, and via first printed conductors 16-1, a first terminal of coil 12 is thus capable of being contacted on an external side of housing 10. According to the first specific embodiment, first contact pad 20-1 is fashioned in the third structured electrically conductive layer, which is situated on a side of first plane E1 facing away from second plane E2.

A second through-contacting 18-2 is likewise fashioned in second plane E2. Second through-contacting 18-2 has a second multiplicity of printed conductors connected in parallel. Second through-contacting 18-2 is also a lateral hermetic through-contacting through housing 10. The second multiplicity of printed conductors connected in parallel is configured in a row between second conductor segment 16-2 and a second contact pad 20-2. Second contact pad 20-2 is situated on the external side of housing 10. Via second contact pad 20-2, second through-contacting 18-2 having the second multiplicity of printed conductors, and via second conductor segment 16-2, a second terminal of coil 12 is thus capable of being contacted on the external side of housing 10. According to the first specific embodiment, second contact pad 20-2 is fashioned in the third structured electrically conductive layer.

According to the first specific embodiment, in second plane E2, in which first and second through-contactings 18-1, 18-2 are also fashioned, in addition four individual first through fourth printed conductors 26-1, 26-2, 26-3, 26-4 are fashioned as further, third through sixth, lateral through-contactings through first wall 11-1. First through-contacting 18-1, second through-contacting 18-2, and first through fourth printed conductors 26-i are, all together, part of a second structured electrically conductive layer 24 that is situated and fashioned inside second plane E2.

According to the first specific embodiment, first through fourth printed conductors 26-i are used for the contacting of a sensing element 22 as second functional element. Sensing element 22 is also situated inside second plane E2.

According to the first specific embodiment, the sensing element is a piezo bridge by which a position of an actuating element can be determined. If sensing element 22 requires a relatively large quantity of electrical current, first through fourth printed conductors 26-i can also each be equipped with multiple parallel branches, analogous to first and second through-contactings 18-1, 18-2. According to the first specific embodiment, the printed conductors of first through sixth through-contactings 18-i, 26-i each have a smaller cross-sectional surface than do first and second conductor segment 16-i and coil 12. Expressed more generally, the current-bearing elements in second layer 24 advantageously have smaller cross-sectional surfaces than do the current-bearing elements in first layer 14.

The actuating element can for example be a movable micro-mirror situated inside the hollow space in housing 10. The actuating element can for example be adjusted through targeted supplying of current to coil 12. A lateral width of the through-contacting printed conductors, i.e. first through fourth printed conductors 26-i and the first and second multiplicity of printed conductors of first and second through-contactings 18-i, is advantageously less than 1 µm. In this way, different printed conductors can have different lateral widths. The lateral width is to be understood as a width in a direction parallel to first and second plane E1, E2, and to first wall 11-1, as well as perpendicular to second and third wall 11-2, 11-3.

The formation of the first and second multiplicity of printed conductors in first and second through-contacting 18-i enables operation of coil 12 with a current at a level of for example more than 100 mA. Due to the small lateral width, mechanical stresses that occur for example when the temperature increases and that could cause cracks in insulating trenches can be reduced. Due to the fact that in each case a multiplicity of printed conductors is fashioned in first and second through-contactings 18-i, a relatively large current can nonetheless be conducted. Advantageously, first and second conductor segment 16-i, as well as coil 12 in first conducting layer 14, each have a cross-section that is as large as possible.

For the contacting of sensing element 22, a metal-silicon contact is realized. According to the first specific embodiment, for the second structured electrically conductive layer 24 a metal, for example copper, advantageously tungsten, is deposited in insulating trenches using chemical gas-phase deposition. That is, according to the first specific embodiment the through-contacting through housing 10, which is realized by first and second through-contactings 18-i and by first through fourth printed conductors 26-i, is realized in tungsten. Alternatively, for example aluminum can also be used. Advantageously, overall as few planes as possible are used in order to keep the complexity of the component, or the technical outlay for the production of the component, as low as possible.

First through fourth printed conductors 26-i are each electrically connected to a third through sixth contact pad 28-1, 28-2, 28-3, 28-4. Third through sixth contact pads 28-i are likewise fashioned on the outside of housing 10, as part of the third structured conductive layer.

Figure 2:
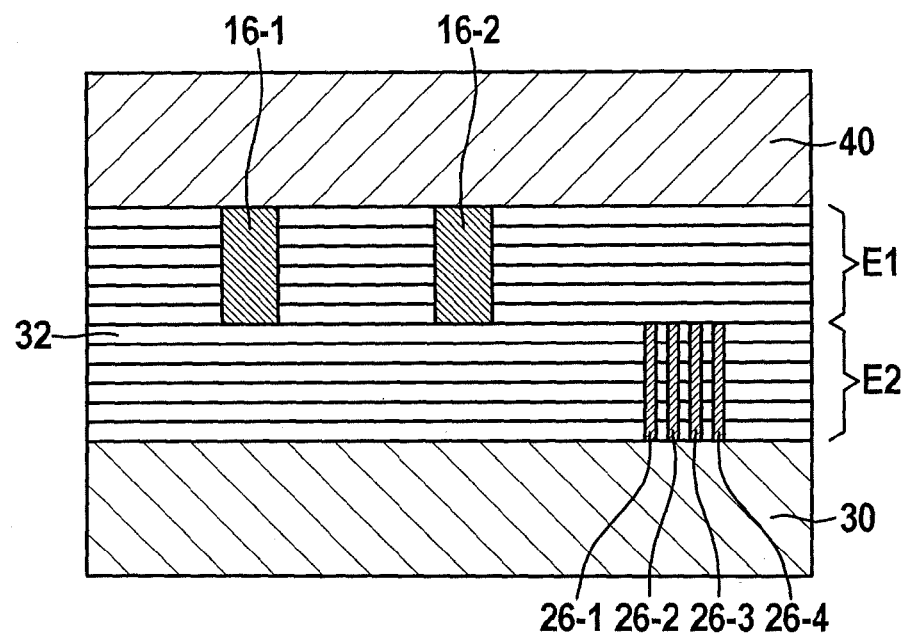
FIG. 2 shows a schematic cross-sectional view along the line A-A' in FIG. 1, through the micromechanical component according to the first specific embodiment.

A cross-section along the line between reference characters A and A' is shown in FIG. 2. A cross-section along the line between B and B' is shown in FIG. 3.

FIG. 2 shows a schematic cross-sectional view along line A-A' in FIG. 1, through the micromechanical component according to the first specific embodiment.

According to FIG. 2, second plane E2 is fashioned on an outer surface 30-f of a first substrate 30. First plane E1 is fashioned on a side of second plane E2 facing away from first substrate 30. On a side of first plane E1 facing away from first substrate 30, there is fashioned or situated a second substrate 40, with an outer surface 40-f. The components of first and second plane E1, E2, which do not belong to first or [second] structured electrically conductive layer 14-24, are advantageously not conductive, and for example have one or more oxide layers 32. Inside the cross-section shown in FIG. 2, first and second structured conductive layer 14, 24 are not in electrical contact. If first structured layer 14 is embedded in an insulating layer, such as an oxide layer 32, this insulating layer simultaneously advantageously acts as a passivation over the through-contactings.

Figure 3:
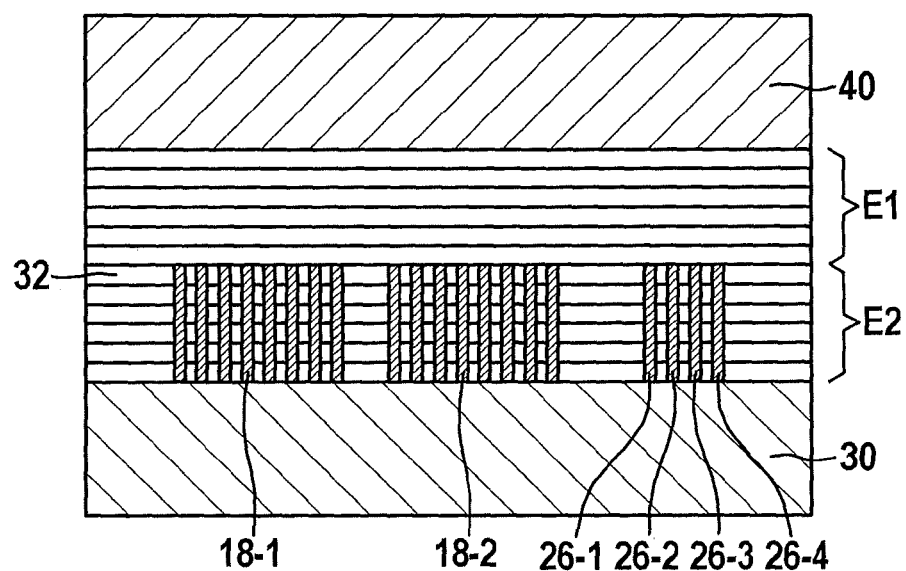
FIG. 3 shows a schematic cross-sectional view along the line B-B' in FIG. 1, through the micromechanical component according to the first specific embodiment.

FIG. 3 shows a schematic cross-sectional view along the line B-B' in FIG. 1, through the component according to the first specific embodiment of the present invention. In the cross-section according to FIG. 3, no element of first structured electrically conductive layer 14 can be seen. The contacting of first conductor segment 16-1 with first through-contacting 18-1, as well as the contacting of second conductor segment 16-2 with second through-contacting 18-2, takes place to a certain extent behind the plane of the drawing, in the region between the cross-sections shown in FIG. 2 and in FIG. 3, as can be seen in FIG. 1.

Figure 4:
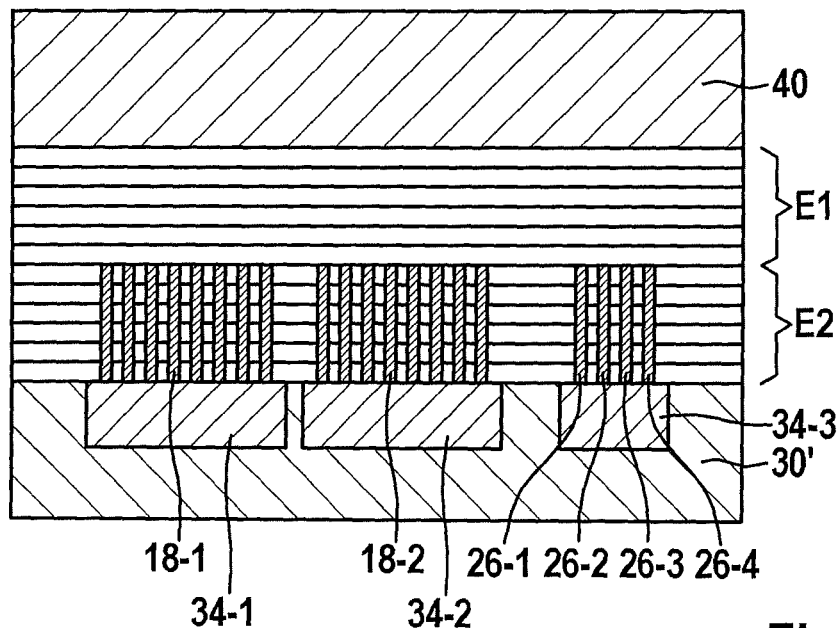
FIG. 4 shows a schematic cross-sectional view through a micromechanical component according to a second specific embodiment of the present invention.

According to FIG. 3, the first and second multiplicity of printed conductors of first and second through-contactings 18-i, as well as first through fourth printed conductors 26-i as third through sixth through-contactings, are all fashioned continuously from outer surface 30-f of first substrate 30 up to first plane E1 as metal-filled trenches, i.e. essentially as flat cuboids. According to the first specific embodiment, the trenches are essentially fashioned perpendicular to outer surface 30-f of first substrate 30, and are essentially parallel to one another. A lateral distance between first and second through-contacting 18-1, 18-2 is here wider than a distance between second through-contacting 18-2 and first through fourth printed conductors 26-i. FIG. 4 shows a schematic cross-sectional view through a micromechanical component according to a second specific embodiment of the present invention.

The second specific embodiment is essentially a variant of the first specific embodiment, differing from the first specific embodiment in the realization of first substrate 30'. According to the second specific embodiment, second structured electrically conductive layer 24 is not electrically insulated from first substrate 30'. In order to avoid currents between second conductive layer 24 and first substrate 30', in first substrate 30' there are fashioned a first, second, and third well 34-1, 34-2, and 34-3, for example by spatially structured doping of substrate 30'.

Wells 34-i are not in direct contact with each other, i.e. they are always kept at a distance from one another by regions of first substrate 30' not having wells. First well 34-1 is fashioned and situated such that first through-contacting 18-1 is connected in electrically conductive fashion to first substrate 30' only via first well 34-1. Second well 34-2 is fashioned and situated such that second through-contacting 18-2 is connected in electrically conductive fashion to first substrate 30' only via second well 34-2. Third well 34-3 is fashioned and situated such that first through fourth printed conductors 26-i are connected in electrically conductive fashion to first substrate 30' only via third well 34-3.

Figure 5:
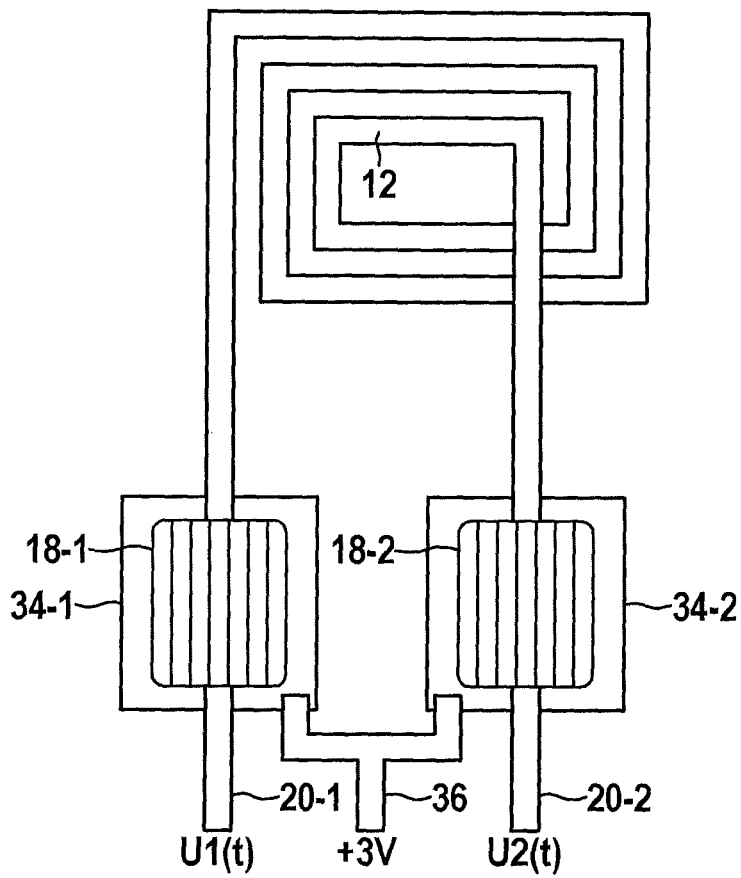
FIG. 5 shows a schematic switching diagram explaining a function of the micromechanical component according to the second specific embodiment of the present invention.

FIG. 5 shows a schematic diagram explaining a function of the micromechanical component according to the second specific embodiment of the present invention. According to the second specific embodiment, first and second well 34-1, 34-2 are applied to a common potential 36, for example 3V. For the operation of coil 12 with alternating current, a first voltage U1(t) that is a function of time t is applied to first contact pad 20-1. A second voltage U2(t) that is a function of time is applied to second contact pad 20-2.

Figure 6:
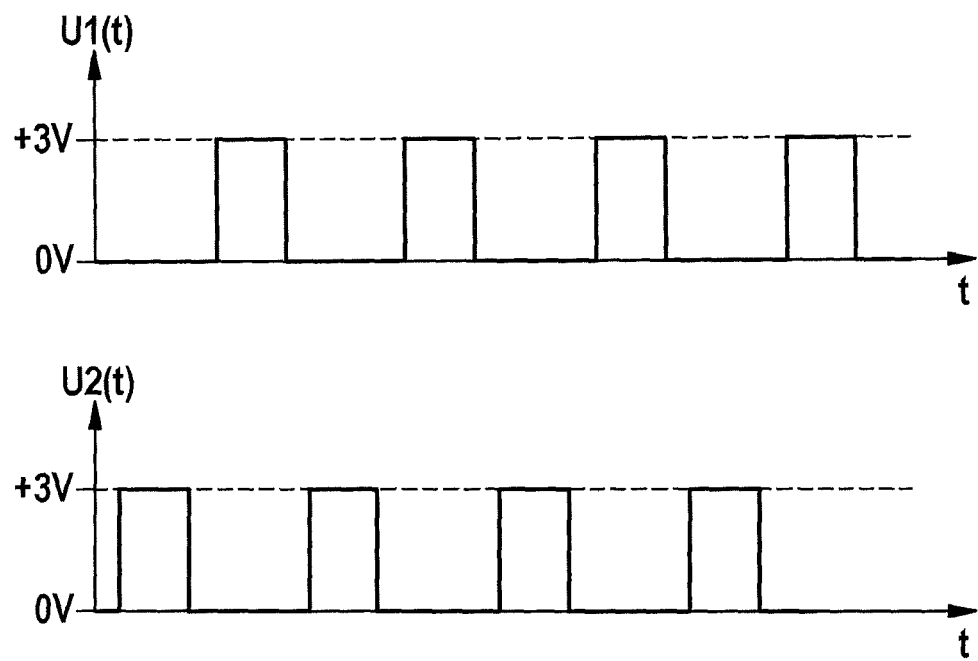
FIG. 6 shows two sample graphs for the explanation of the function of the micromechanical component according to the second specific embodiment.

FIG. 6 shows two sample graphs explaining the function of the micromechanical component according to the second specific embodiment. The upper graph in FIG. 6 shows the time curve of first voltage U1(t). The lower graph in FIG. 6 shows a time curve of second voltage U2(t). First and second voltage U1(t), U2(t) are each the same type of square wave, essentially assuming a discrete value of 0V or 3V. First voltage U1 is shifted on the time (t) axis relative to second voltage U2(t) in such a way that in each case either only the first voltage U1(t) or the second voltage U2(t) or neither of the two voltages assumes the value of 3V.

The peak value of the rectangular oscillation is equal to the potential to which first and second well 34-1, 34-2 are applied. Wells 34-1, 34-2 are thus poled in such a way that they act in insulating fashion relative to first substrate 30', as n-wells. In the case of p-wells, the sign of the polarity can be changed. The polarity of first and second voltages U1(t), U2(t), and of wells 34-1, 34-2 prevents or reduces the occurrence of undesirable exciting signals, for example in the sensing circuit of sensing element 24, which otherwise could occur due to path currents in first substrate 30'.

Figure 7:
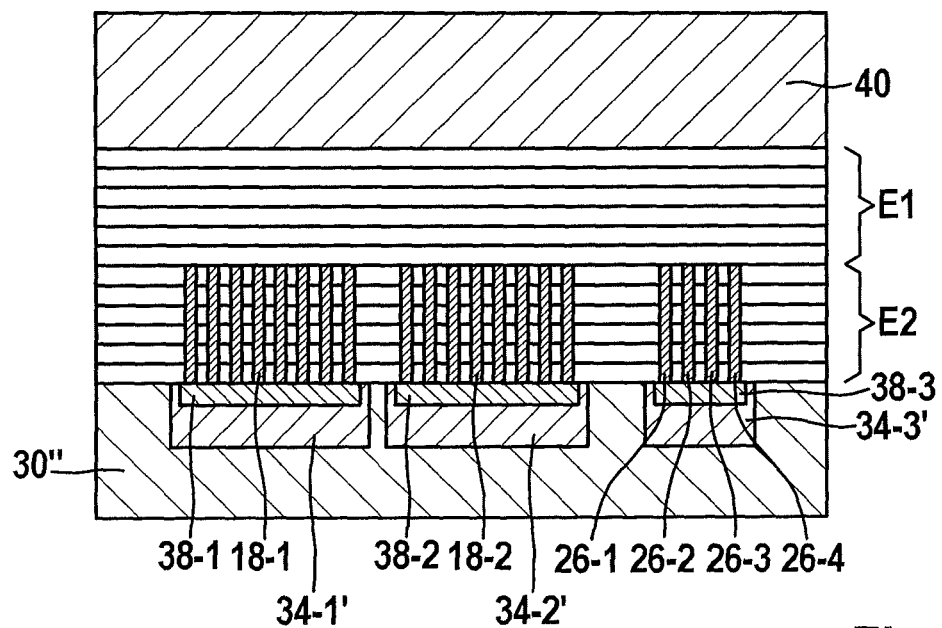
FIG. 7 shows a schematic cross-sectional view through a micromechanical component according to a third specific embodiment of the present invention.

FIG. 7 shows a schematic cross-sectional view through a micromechanical component according to a third specific embodiment of the present invention. The third specific embodiment is essentially a variant of the second specific embodiment, and differs from the second specific embodiment in the realization of first substrate 30", in particular in the realization of first through third wells 34-1', 34-2', 34-3'.

According to the third specific embodiment, in each of wells 34-i' there is fashioned a salicidated silicon resistor 38-1, 38-2, 38-3. The respective salicidated silicon resistor 38-i is, as described in reference to FIGS. 5 and 6, electrically insulated in each case by a pre-poled well 34-i'. Salicidated silicon resistor 38-i is in each case connected between first through-contacting 18-1, or through-contacting 18-2 or first through fourth printed conductors 26-i, and the corresponding well 34-i'.

In the deposition of a metallization, as can be used to form printed conductors 18-1, 18-2, 26-i in second structured electrically conductive layer 24, so-called voids can occur which can result in a narrowing of a cross-section of one of the printed conductors. In the worst case, there can occur a complete interruption of one of the printed conductors. Through the large numbers of printed conductors present in first through-contacting 18-1 and second through-contacting 18-2 according to the first or second specific embodiment, it can already be achieved that a failure of one of the printed conductors does not cause a significant increase in a resistance. Through the formation of printed conductors 18-1, 18-2, 26-i on salicidated resistors 38-i, the influence of a printed conductor interrupted at a point can be practically completely leveled out.

Figure 8:
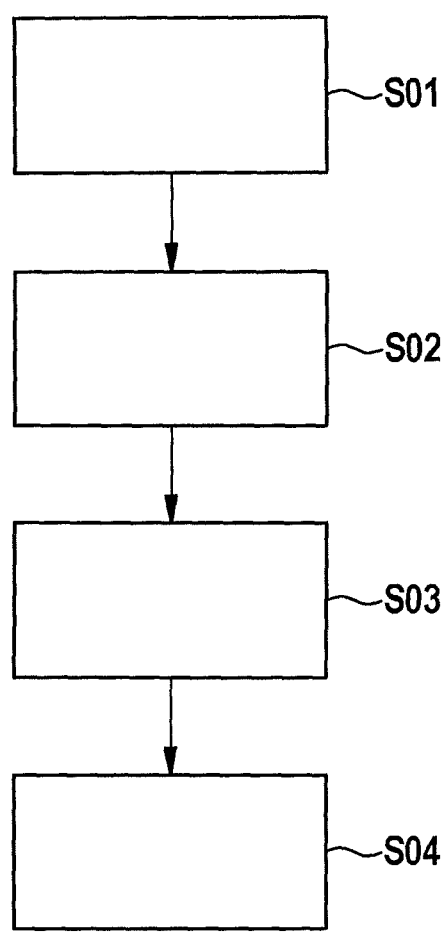
FIG. 8 shows a schematic flow diagram for the explanation of a method for producing a micromechanical component according to a further specific embodiment of the present invention.

FIG. 8 shows a schematic flow diagram of a method for producing a micromechanical component according to a further specific embodiment of the present invention. The numbering of the method steps is not intended to imply a sequence; a plurality of method steps can also take place simultaneously. More detailed properties of the micromechanical component according to the present invention, also relating to its production, can be learned from the description of the above FIGS. 1 through 7.

In a step S01, a first functional element 12 is fashioned on a first substrate 30; 30'; 30". In a step S02, a first structured electrically conductive layer 14 that contacts first functional element 12 is fashioned on first substrate 30; 30'; 30". In a step S03, a second structured electrically conductive layer 24 is fashioned on first substrate 30; 30'; 30", first conductive layer 14 being electrically contacted via second conductive layer 24.

In a step S04, a housing 10 that hermetically seals first functional element 12 and first structured electrically conductive layer 14 is fashioned, second conductive layer 24 being capable of being electrically contacted laterally through housing 10 via a hermetic through-contacting 18-i, 26-i in second conductive layer 24.

Although in the foregoing the present invention has been described on the basis of preferred exemplary embodiments, it is not limited thereto, but rather can be modified in many ways. In particular, the present invention can be modified in many ways without departing from the core idea of the present invention.

For example, the production method can take place both beginning with first substrate 30; 30'; 30" and also beginning with second substrate 40. First plane E1 can also be fashioned on second substrate 40, while second plane E2 is fashioned on first substrate 30; 30'; 30", whereupon the two resulting wafers are bonded to one another.

A nucleus for a metallization, for example for the formation of the first and/or the second conductive layer 14, 24, can preferably take place by physical or chemical gas phase deposition. The actual metallization, preferably with copper, can take place by electrochemical deposition.

For the contacting of a functional element made of silicon with an adjacent metallic wiring, for example made of aluminum, tungsten plugs can be used that preferably have a diameter of from 0.1 to 0.3 μm.

One or all of wells 34-i; 34-i' can be capable of being contacted going out from the third structured electrically conductive layer.

What is claimed is:

1. A micromechanical component having a hermetic through-contacting, comprising:
    a hermetically sealed housing;
    a first functional element situated inside the housing;
    a first structured electrically conductive layer situated inside the housing and contacting the first functional element;
    a second structured electrically conductive layer, wherein the first conductive layer is electrically contacted via the second conductive layer, and wherein the second conductive layer is electrically contacted laterally through the housing via a hermetic through-contacting in the second conductive layer; and
    a second functional element situated inside the housing and having a second current requirement which is less than a first current requirement of the first element, wherein the second functional element is electrically contacted via the second conductive layer
wherein:
    the second conductive layer has an electrical connection to the substrate, the electrical connection taking place via a first well configured in the substrate, and wherein the first well has a polarity in the blocking direction relative to the substrate;
    a first contact of the first component is contacted via a first segment of the hermetic through-contacting;
    a second contact of the first component is contacted via a second segment of the hermetic through-contacting;
    the first segment of the hermetic through-contacting is connected to the substrate via the first well fashioned in the substrate; and
    the second segment of the hermetic through-contacting is connected to the substrate via a second well fashioned in the substrate.

2. The micromechanical component as recited in claim 1, wherein the first and the second wells are applied to a common potential.

3. The micromechanical component as recited in claim 1, wherein at least one of:
    a metallization of the through-contacting is in tungsten;
    a metallization of the through-contacting is situated over at least one of salicidated silicon and a diffusion; and
    a metallization of at least one of the first element and the first conductive layer is in copper.

4. The micromechanical component as recited in claim 1, wherein the hermetic through-contacting includes a multiplicity of printed conductors connected in parallel, and wherein each one of the multiplicity of printed conductors is separated from adjacent conductors by the housing.

5. The micromechanical component as recited in claim 4, wherein the housing has a substrate on which a bonding frame is attached, and wherein the second conductive layer is situated between the first conductive layer and the substrate.

6. The micromechanical component as recited in claim 5, wherein the second conductive layer is electrically insulated from the substrate.

* * * * *